United States Patent
Ueda

(10) Patent No.: US 8,045,355 B2
(45) Date of Patent: Oct. 25, 2011

(54) SEMICONDUCTOR MEMORY DEVICE INCLUDING A REFERENCE CELL

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 12/367,792

(22) Filed: Feb. 9, 2009

(65) Prior Publication Data

US 2009/0201710 A1    Aug. 13, 2009

(30) Foreign Application Priority Data

Feb. 13, 2008    (JP) .................................. 2008-32118

(51) Int. Cl.
G11C 5/02    (2006.01)

(52) U.S. Cl. ........................ 365/51; 365/158; 365/171

(58) Field of Classification Search ............... 365/51, 365/158, 171
See application file for complete search history.

(56) References Cited

U.S. PATENT DOCUMENTS

| | | | | |
|---|---|---|---|---|
| 5,699,293 A * | 12/1997 | Tehrani et al. | ................ | 365/158 |
| 6,055,178 A * | 4/2000 | Naji | ............... | 365/158 |
| 6,385,097 B1 * | 5/2002 | Liao et al. | ................ | 365/189.07 |
| 6,791,887 B2 * | 9/2004 | Hung et al. | .............. | 365/189.09 |
| 6,947,322 B2 * | 9/2005 | Anzai et al. | ............... | 365/185.03 |
| 7,020,037 B2 * | 3/2006 | Anzai et al. | ................ | 365/210.1 |
| 7,259,992 B2 * | 8/2007 | Shirota | .................... | 365/185.21 |
| 2008/0273384 A1 * | 11/2008 | Sarin et al. | ............... | 365/185.03 |
| 2009/0237977 A1 * | 9/2009 | Ramani et al. | ................ | 365/148 |

FOREIGN PATENT DOCUMENTS

JP    2002-541613    12/2002

* cited by examiner

*Primary Examiner* — Connie Yoha
(74) *Attorney, Agent, or Firm* — Oblon, Spivak, McClelland, Maier & Neustadt, L.L.P.

(57) ABSTRACT

A semiconductor memory device comprises a plurality of cell arrays, each cell array including a plurality of mutually parallel word lines, a plurality of mutually parallel bit lines disposed to cross these word lines, and a plurality of cells connected to the intersections of these word lines and bit lines, respectively, one portion of the cell arrays forming a memory cell array that has the cells as memory cells, and another portion of the cell arrays forming a reference cell array that has the cells as reference cells. A cell selection circuit is operative to select from the memory cell array a memory cell whose data is to be read, and to select from the reference cell array a reference cell at a position corresponding to a position of the memory cell selected in the memory cell array. A sense amplifier circuit is operative to detect and compare a current or a voltage of the selected memory cell with a current or a voltage of the selected reference cell, and thereby read data of the memory cell.

20 Claims, 16 Drawing Sheets

FIG. 6
(a) SchottkyStructure
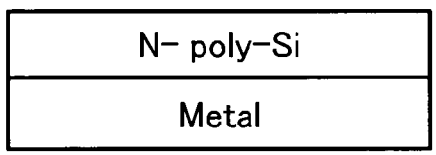
(b) PN Structure
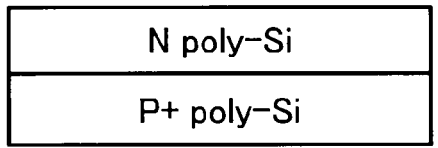
(c) PIN Structure
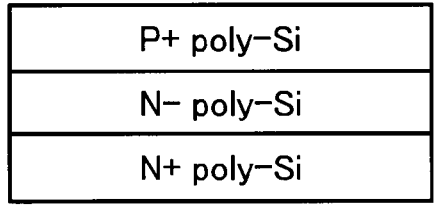
(d) MIM Structure
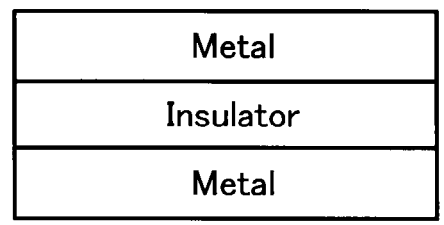
(e) SIS Structure
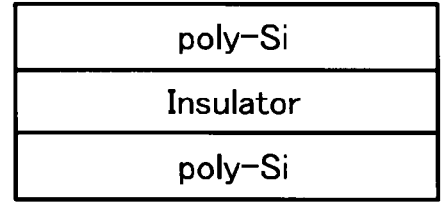

SEMICONDUCTOR MEMORY DEVICE INCLUDING A REFERENCE CELL

CROSS-REFERENCE TO RELATED APPLICATIONS

This application is based upon and claims the benefit of priority from the prior Japanese Patent Application No. 2008-32118, filed on Feb. 13, 2008, the entire contents of which are incorporated herein by reference.

BACKGROUND OF THE INVENTION

1. Field of the Invention

The present invention relates to a semiconductor memory device having a reference cell that serves as a reference during data read.

2. Description of the Related Art

In recent years attention has been given to a nonvolatile memory configured as an array of memory cells, each memory cell formed by connection of a variable resistor to the intersection of a word line and a bit line.

Known as this kind of nonvolatile memory are the likes of a PCRAM (Phase-Change Random Access Memory) using a chalcogenide element in the variable resistor; a ReRAM (Resistance Random Access Memory) using a transition metal oxide element; and what is known as a CBRAM in which metal cations are deposited to form an inter-electrode bridge (conducting bridge) and resistance is varied by ionizing the deposited metal to destroy the bridge. The feature of these variable-resistance memories lies in the fact that variations in resistance are stored as information.

In PCRAM, resistance of a chalcogenide element is varied by causing phase change of the element into a crystalline state or an amorphous state, through control of a process effected on the element that ranges from heating through cooling depending on the size and form, for example, width of a current/voltage pulse applied to the element (refer to Patent Document 1: JP2002-541613T). ReRAMs can be of bipolar type and unipolar type. In the case of a bipolar type, resistance of a transition metal oxide element is controlled by the direction of a current/voltage pulse applied to the element. On the other hand, in the case of a unipolar type, resistance of the transition metal oxide element is controlled by the size, width and so on of the current/voltage pulse applied to the element.

Reading of information from these variable-resistance memories is effected by passing a read current through a memory cell and a reference cell, converting their respective resistances into voltages, then comparing the voltages of the memory cell and reference cell.

In the above-described nonvolatile memories, the parasitic resistance of word lines and bit lines differs according to cell position within the array and the drop in voltage caused thereby means that it is sometimes not possible to accurately read the voltage of the memory cell and reference cell. As a result, there is a possibility that the actual data stored in a variable resistor may be misread.

SUMMARY OF THE INVENTION

In one aspect the present invention provides a semiconductor memory device, comprising: a plurality of cell arrays, each cell array including a plurality of mutually parallel word lines, a plurality of mutually parallel bit lines disposed to cross these word lines, and a plurality of cells connected to the intersections of these word lines and bit lines, respectively, one portion of the cell arrays forming a memory cell array that has the cells as memory cells, and another portion of the cell arrays forming a reference cell array that has the cells as reference cells; a cell selection circuit operative to select from the memory cell array a memory cell whose data is to be read, and to select from the reference cell array a reference cell at a position corresponding to a position of the memory cell selected in the memory cell array; and a sense amplifier circuit operative to detect and compare a current or a voltage of the selected memory cell with a current or a voltage of the selected reference cell, and thereby read data of the memory cell.

In another aspect the present invention provides a semiconductor memory device, comprising: a plurality of cell arrays, each cell array including a plurality of mutually parallel word lines, a plurality of mutually parallel bit lines disposed to cross these word lines, and a plurality of cells connected to the intersections of these word lines and bit lines, respectively, one portion of the cell arrays forming a memory cell array that has the cells as memory cells, and another portion of the cell arrays forming a reference cell array that has the cells as reference cells; a decoder provided to each cell array and operative to select a cell; and a sense amplifier circuit operative to detect and compare a current or a voltage of the memory cell and reference cell selected by the decoder, and thereby read data of the memory cell; wherein, during data read, the decoder provided to the reference cell array selects a predetermined reference cell so that a relative position of the selected reference cell with respect to the decoder for the reference cell array is the same as the relative position of the selected memory cell with respect to the decoder for the memory cell array.

In yet another aspect the present invention provides a semiconductor memory device, comprising: a cell array including a plurality of mutually parallel word lines, a plurality of mutually parallel bit lines disposed to cross these word lines, and a plurality of cells connected to the intersections of these word lines and bit lines; a cell selection circuit operative to select as a memory cell a cell whose data is to be read, and to select as a reference cell another cell such that a reference current pathway of the selected reference cell has an equivalent resistance to a read current pathway of the selected memory cell; and a sense amplifier circuit operative to detect and compare a current or a voltage of the selected memory cell with a current and a voltage of the selected reference cell, and thereby read data of the memory cell.

BRIEF DESCRIPTION OF THE DRAWINGS

FIG. 6 is a schematic cross-sectional view showing an example of a non-ohmic element in the same embodiment.

DETAILED DESCRIPTION OF THE EMBODIMENTS

First Embodiment

A first embodiment of the present invention will now be described with reference to the drawings.

[Overall Configuration]

Figure 1:
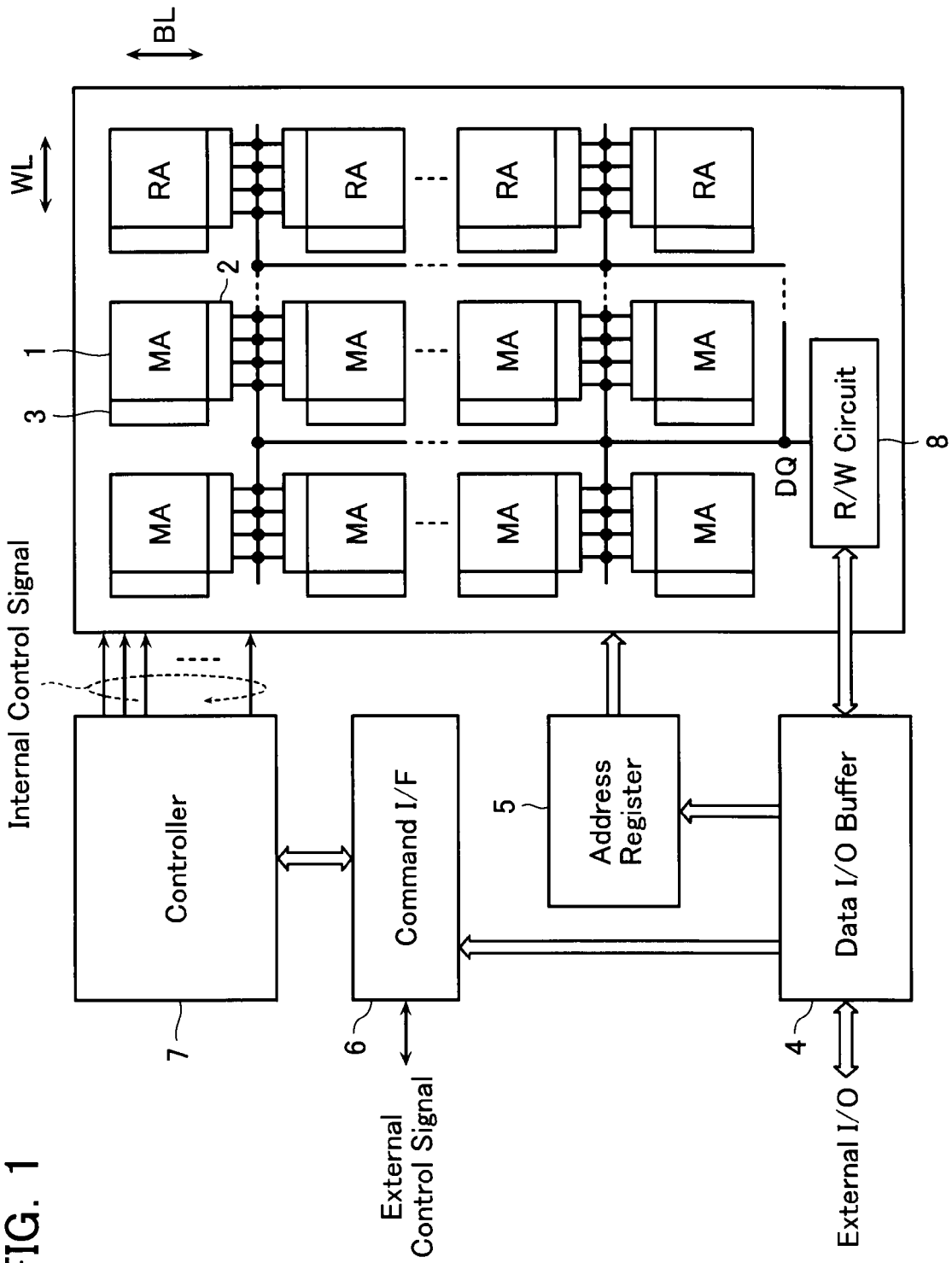
FIG. 1 is a block diagram of a nonvolatile memory according to a first embodiment of the present invention.

FIG. 1 is a block diagram of a nonvolatile memory according to a first embodiment of the present invention.

The nonvolatile memory includes a plurality of cell arrays 1 arranged as a matrix and using as memory cells variable-resistance type elements of such kinds as ReRAM and PCRAM to be described later. A portion of the plurality of cell arrays 1 are used as memory cell arrays MA and another portion of the cell arrays 1 are used as reference cell arrays RA. A column decoder 2 operative to select and drive a bit line BL of the cell array 1 is provided at a position adjacent to each cell array 1 in the bit line BL direction. A row decoder 3 operative to select and drive a word line WL of the cell array 1 is provided at a position adjacent to the cell arrays 1 in the word line WL direction. A read/write circuit (hereafter referred to as "R/W circuit") 8 is connected to one of either the column decoder 2 or the row decoder 3, in this example, to the column decoder 2. The R/W circuit 8, which includes therein a write driver, sense amplifier, latch circuit, and so on, holds read or write data internally, and supplies a voltage necessary for read and write to the bit line BL via the column decoder 2.

A data I/O (input/output) buffer 4 is connected to an external host, not shown, via an I/O line and operates to receive write data, to receive erase instructions, to provide read data, and to receive address data and command data.

The data I/O buffer 4 sends received write data to the column decoder 2 via the R/W circuit 8 and receives read-out data from the column decoder 2 via the R/W circuit 8 and provides it to external. An address fed from external to the data I/O buffer 4 is sent to the column decoder 2 and the row decoder 3 via an address register 5. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a controller 7. The controller 7 manages the entire nonvolatile memory to receive commands from the host, read, write, erase, and execute data I/O management. In addition it is also possible for the external host to receive status information managed by the controller 7 and decide an operational result. The status information may also be used in control of write and erase.

The R/W circuit 8 is controlled by the controller 7. This control allows the R/W circuit 8 to provide a pulse with any voltage or timing. Here, the pulse generated can be transferred to any lines selected by the column decoder 2 and the row decoder 3.

The R/W circuit 8 includes a sense amplifier circuit (hereafter referred to as "S/A circuit") operative to compare the current flowing in a memory cell and the current flowing in a reference cell, thereby reading data stored in the memory cell, as described later. Alternatively, it is also possible to execute the read by applying a fixed current bias to the memory cell and reference cell, and using the R/W circuit to compare the respectively outputted voltages.

Note that the cell arrays 1 are formed in a line layer and that peripheral circuit elements other than the cell arrays 1 can be formed on the silicon substrate directly below this line layer of which the cell arrays 1 form a part, thereby enabling the chip area of the nonvolatile memory to be set almost equal to the area of the matrix of cell arrays 1.

[Memory Block and Peripheral Circuits]

Figure 2:
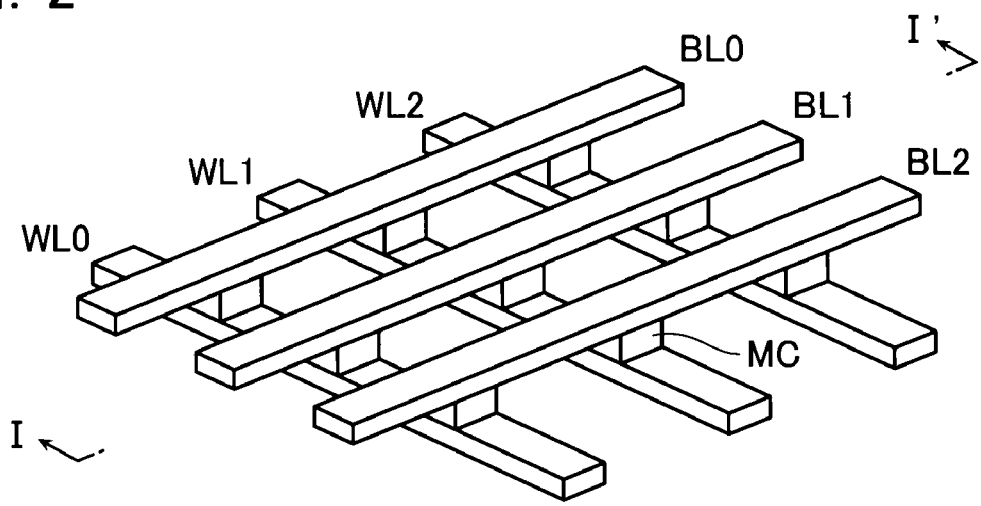
FIG. 2 is a perspective view of part of a memory cell array in the nonvolatile memory according to the same embodiment.
Figure 3:
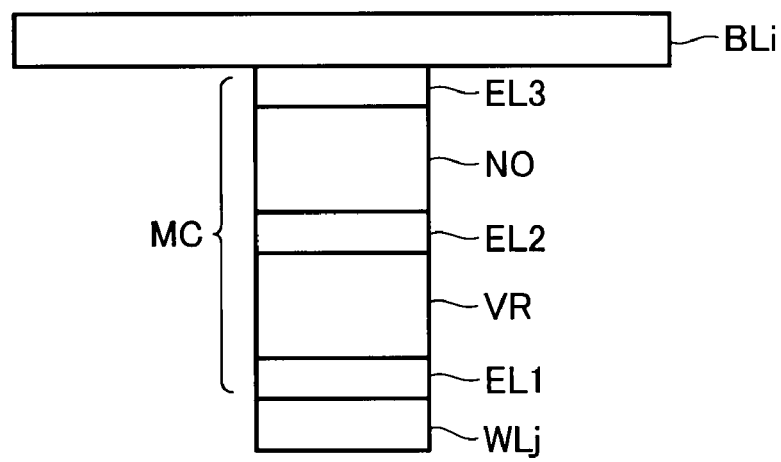
FIG. 3 is a cross-sectional view taken along line I-I' and looking in the direction of the arrow in FIG. 2, showing a single memory cell portion.

FIG. 2 is a perspective view of part of a memory cell array 1, and FIG. 3 is a cross-sectional view taken along line I-I' and looking in the direction of the arrow in FIG. 2, showing a single memory cell portion.

There are plural first lines or word lines WL0-WL2 disposed in parallel, which cross plural second lines or bit lines BL0-BL2 disposed in parallel. A memory cell MC is arranged at each intersection of both lines so as to be sandwiched therebetween. Desirably, the first and second lines are composed of a heat-resistive low-resistance material such as W, WSi, NiSi, or CoSi.

The memory cell MC comprises a serial connection circuit of a variable resistor VR and a non-ohmic element NO, as shown in FIG. 3.

The variable resistor VR can vary the resistance through current, heat, or chemical energy on voltage application. Arranged on an upper and a lower surface thereof are electrodes EL1 and EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

The variable resistor VR may include one such as chalcogenide that varies the resistance through the phase change between the crystalline state and the amorphous state (PCRAM); one in which metal cations are deposited to form an inter-electrode bridge (conducting bridge) and resistance is varied by ionizing the deposited metal to destroy the bridge (CBRAM); or one in which the resistance varies through application of a voltage or a current (ReRAM) (ReRAMs are broadly divided into those in which a change of resistance occurs through the presence or absence of a charge trapped in a charge trap existing in the electrode interface, and those in which a change of resistance occurs through the presence or absence of a conduction path arising from an oxygen deficit or the like).

Figure 4:
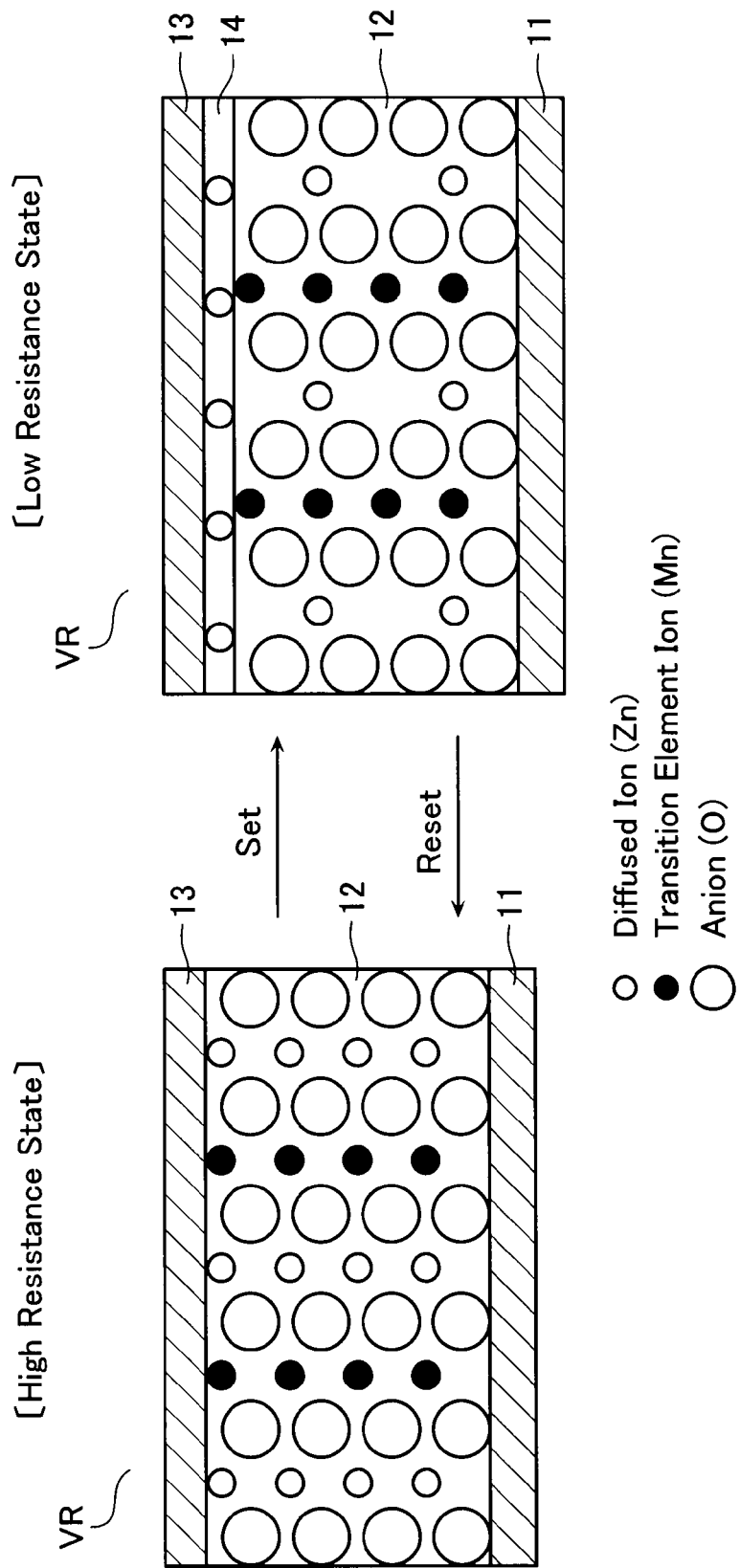
FIG. 4 is a schematic cross-sectional view showing an example of a variable resistor in the same embodiment.
Figure 5:
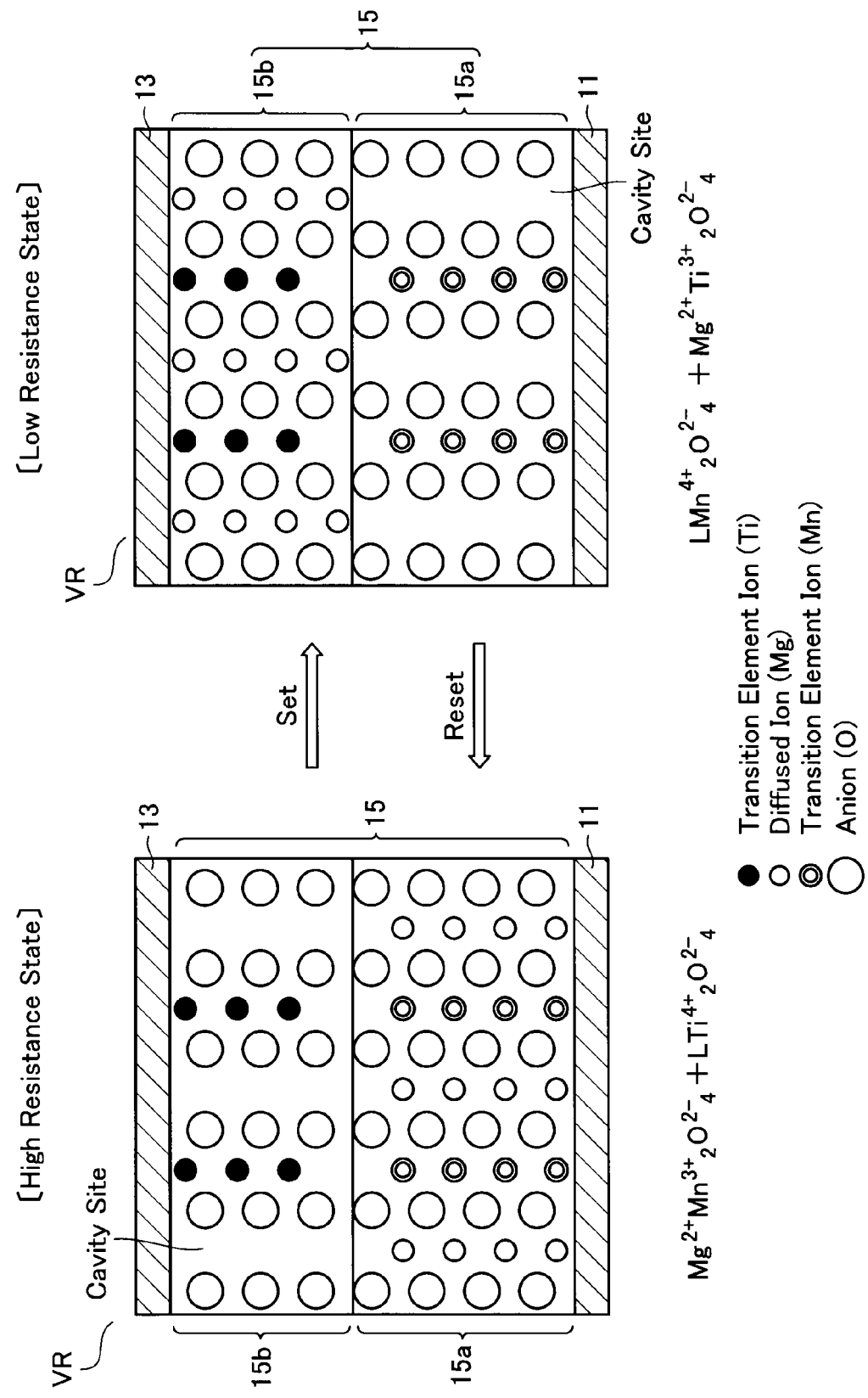
FIG. 5 is a schematic cross-sectional view showing another example of a variable resistor in the same embodiment.

FIGS. 4 and 5 show an example of ReRAM. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystalline structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($AMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has cavity sites (L) capable of accommodating cation elements from the first compound layer 15a.

In the example of FIG. 5, in the first compound layer 15a, A comprises Mg, M1 comprises Mn, and X1 comprises O. The second compound layer 15b contains Ti shown with black circles as transition reduction ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes cavity sites capable of accommodating diffused ions. Accordingly, the diffused ions moved from the first compound layer 15a are trapped in the cavity sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for a sufficient time for Joule heating to facilitate the oxidation reduction reaction in the recording layer 15, as in the preceding example. Application of an electric field in the opposite direction from that at the time of setting may also allow reset.

The non-ohmic element NO may include various diodes such as (a) a Schottky diode, (b) a PN-junction diode, (c) a PIN diode and may have (d) a MIM (Metal-Insulator-Metal) structure, and (e) a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistor VR may be arranged in the opposite up/down relation from FIG. 3. Alternatively, the non-ohmic element NO may have the up/down-inverted polarity.

Figure 7:
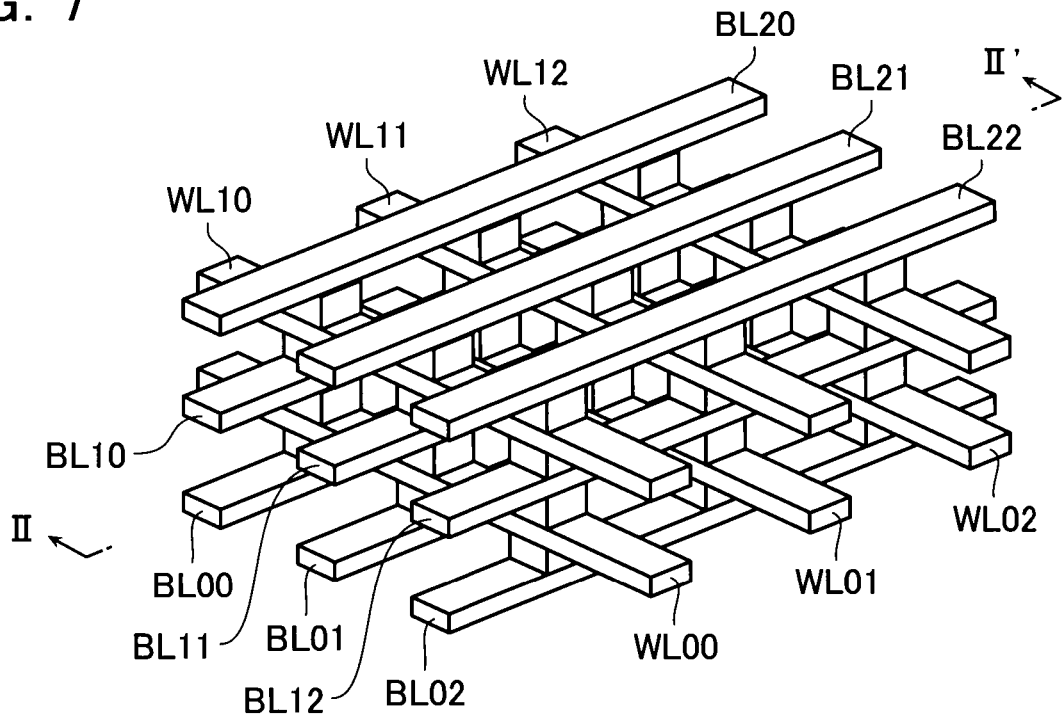
FIG. 7 is a perspective view showing part of a memory cell array according to a variant example of the same embodiment.
Figure 8:
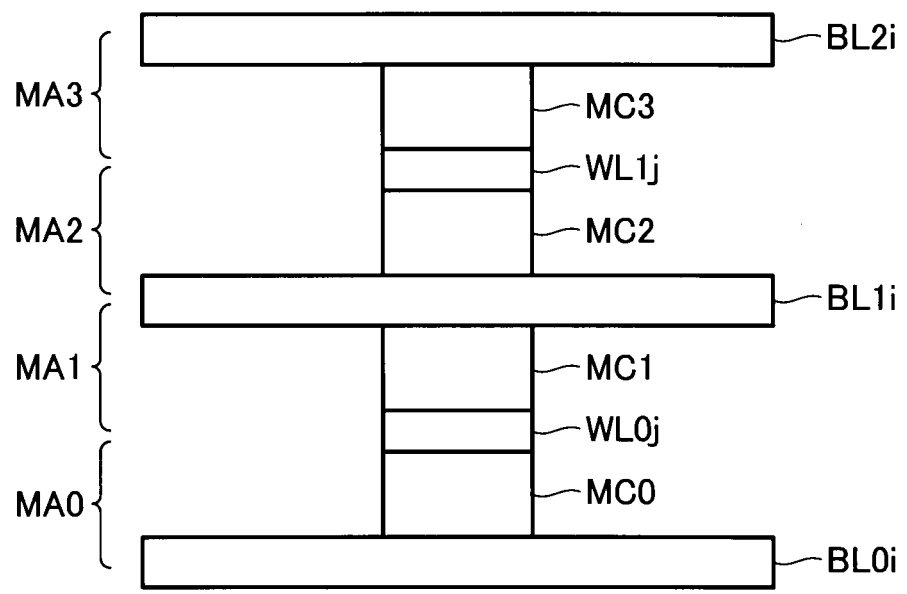
FIG. 8 is a cross-sectional view taken along line II-II' and looking in the direction of the arrow in FIG. 7, showing a single memory cell portion.

Plural such memory structures described above may be stacked to form a three-dimensional structure as shown in FIG. 7. FIG. 8 is a cross-sectional view showing a II-II' section of FIG. 7. The shown example relates to a memory cell block of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3. In place of the line/cell/line repetition, an interlayer insulator may be interposed as a line/cell/line/interlayer-insulator/line/cell/line between cell array layers.

Figure 9:
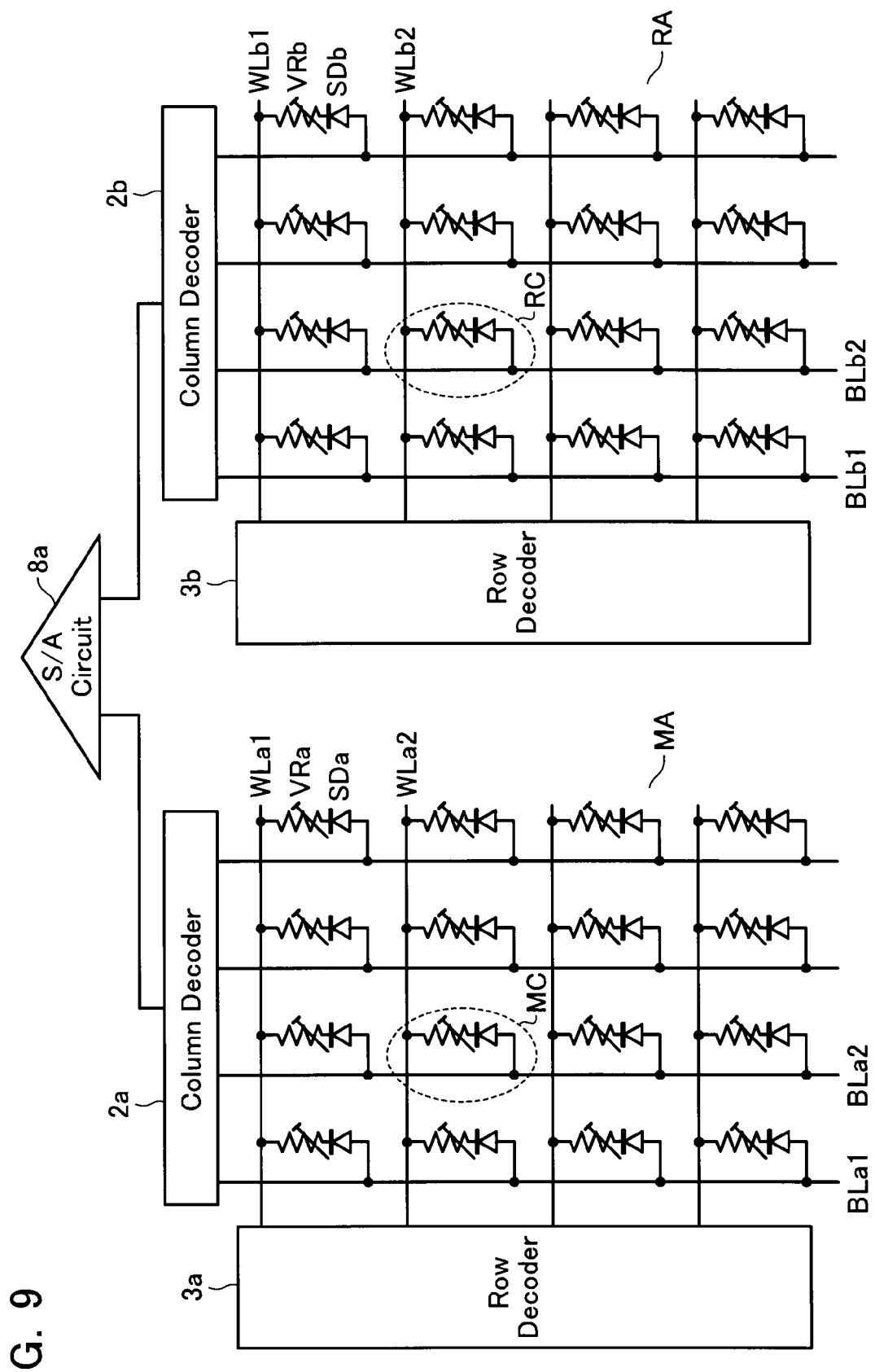
FIG. 9 is a circuit diagram of a memory cell array, a reference cell array, and peripheral circuits thereof in the nonvolatile memory according to the same embodiment.

FIG. 9 is an equivalent circuit diagram showing details of a memory cell array MA and a reference cell array PA of FIG. 1. Note that a diode SD is used as the non-ohmic element NO and that, for simplicity, the description advances on the assumption that the memory has a single-layered structure.

Figure 10:
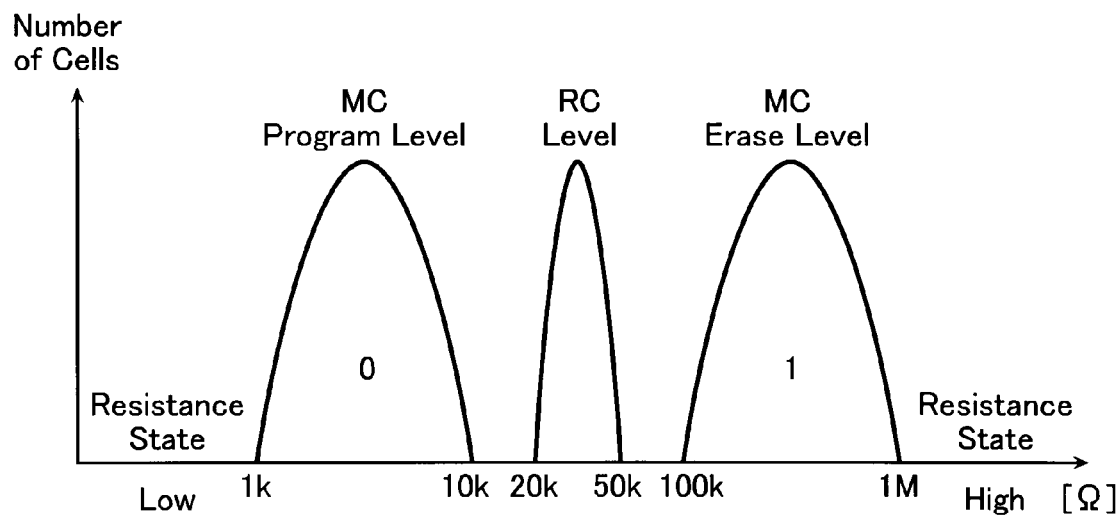
FIG. 10 is a graph showing the relationship between resistance distribution and data in a memory cell in the case of binary data.

In FIG. 9, a memory cell MC of a memory cell array MA is configured by a serially connected diode SDa and a variable resistor VRa. The anode of diode SDa is connected to a bit line BLa and the cathode is connected to a word line WLa via variable resistor VRa. One end of each bit line BLa is connected to a column decoder 2a; and one end of each word line WLa is connected to a row decoder 3a. Meanwhile, a reference cell array RA is also configured under the same production conditions and with the same layout as the memory cell array MA. That is to say, a reference cell RC is configured by a serially connected diode SDb and a variable resistor VRb. The anode of diode SDb is connected to a bit line BLb, and the cathode is connected to a word line WLb via variable resistor VRb. One end of each bit line BLb is connected to a column decoder 2b; and one end of each word line WLb is connected to a row decoder 3b. The resistance of variable resistor VRb in reference cell RC is set to a value suitable for generating a reference current; for example, it is set to an intermediate value between those of the resistance of program (set) level "0" and the resistance of erase (reset) level "1" of the variable resistor VRa in memory cell MC, as shown in FIG. 10.

There is a configuration such that outputs of column decoders 2a and 2b are inputted to a sense amplifier circuit (hereafter referred to as "S/A circuit") 8a internally provided in R/W circuit 8 and compared.

Figure 11:
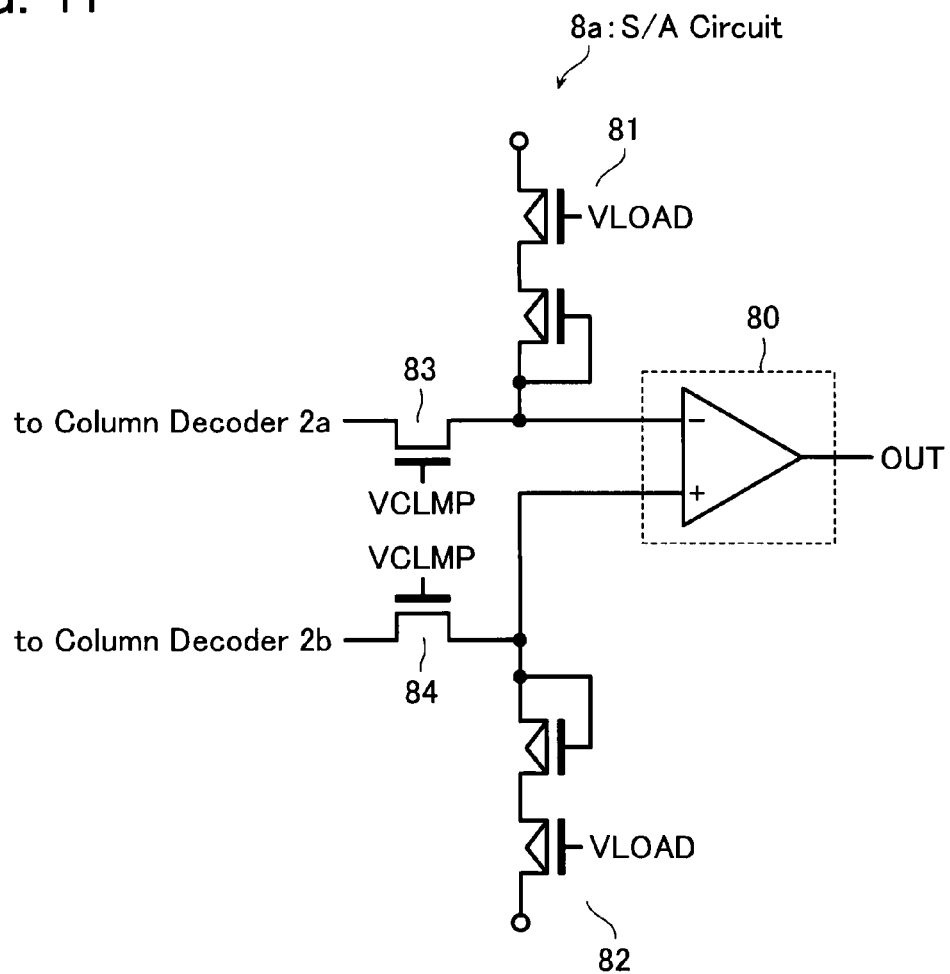
FIG. 11 is a circuit diagram showing a configuration of a sense amplifier in the same embodiment.

The sense amplifier circuit 8a may, for example, be configured by a differential sense amplifier of the kind shown in FIG. 11. Memory cell array MA side bit line BLa selected by column decoder 2a is connected via a selection transistor 83 comprising an NMOS transistor to an inverting input terminal of differential amplifier 80, and reference cell array RA side bit line BLb selected by column decoder 2b is connected via a selection transistor 84 comprising an NMOS transistor to a non-inverting input terminal of differential amplifier 80. In addition, a current source load 81 comprising a PMOS transistor is connected to the inverting input terminal of differential amplifier 80, and a current source load 82 comprising a PMOS transistor is connected to the non-inverting input terminal of differential amplifier 80.

In the sense amplifier circuit 8a, each input terminal of differential amplifier 80 is connected via the respective current source loads 81 and 82 to a power supply voltage Vdd by means of a control signal $V_{LOAD}$, and differential amplifier 80 detects a differential current flowing in bit lines BLa and BLb through application of a selection signal $V_{CLMP}$ to selection transistors 83 and 84.

[Data Read]

In the above-described circuits, data is stored in each memory cell MC as the resistance of the variable resistor VRa, as shown in FIG. 10. During data read, the row decoder 3a on the memory cell array MA side sets a selected word line WLa to "L" level and a non-selected word line WLa to "H" level; and the column decoder 2a connects a selected bit line BLa to the S/A circuit 8a and sets a non-selected bit line BLa to "L" level. Concurrently, the row decoder 3b on the reference cell array RA side sets a selected word line WLb to "L" level and a non-selected word line WLb to "H" level; and the column decoder 2b connects a selected bit line BLb to the S/A circuit 8a and sets a non-selected bit line BLb to "L" level. In this way, the S/A circuit 8a detects the sizes of a current flowing in selected memory cell MC and a current flowing in selected reference cell RC.

In the present embodiment, the reference cell RC is selected so that a relative position of selected memory cell MC in memory cell array MA is identical to a relative position of selected reference cell RC in reference cell array RA, as shown in FIG. 9. In the example shown in the figure, the memory cell array MA side column decoder 2a and row decoder 3a select a memory cell MC which is second from the top where column decoder 2a is disposed and second from the left where row decoder 3a is disposed, and at the same time the reference cell array RA side column decoder 2b and row decoder 3b also are selecting a reference cell RC which is second from the top and second from the left and shown surrounded by a dotted line in the figure.

By selecting a reference cell RC with the same relative position as the memory cell MC in this way, the resistances of the bit line BL portion and word line WL portion of the read current pathway and reference current pathway are configured to be equal. In this way, the parasitic resistance of the bit line BL and word line WL can be made equal for the read current pathway and reference current pathway, and a read of high precision can be realized, regardless of the position (address) of the selected memory cell.

Second Embodiment

Figure 12:
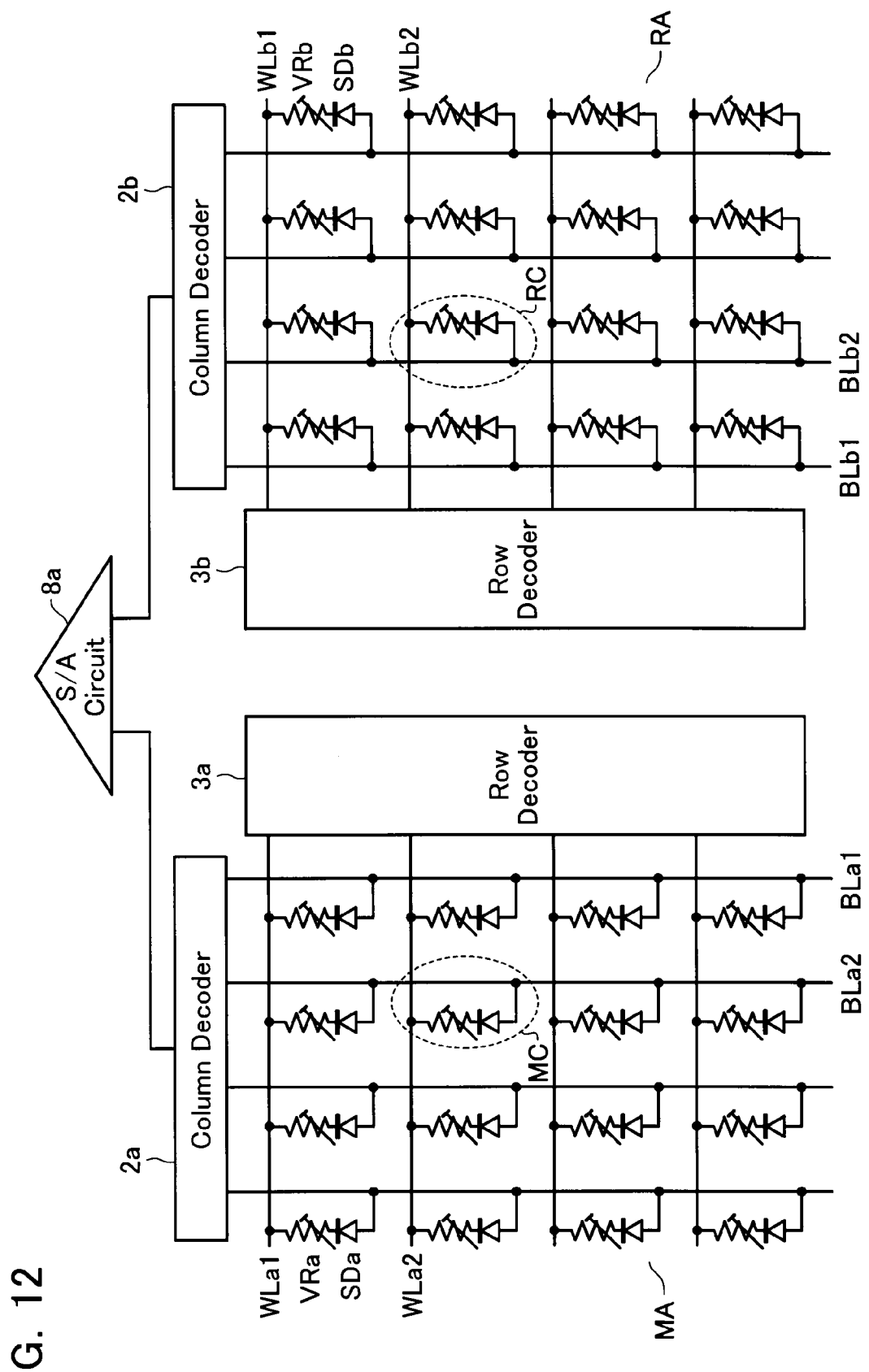
FIG. 12 is a circuit diagram of a memory cell array, a reference cell array, and peripheral circuits thereof in a nonvolatile memory according to a second embodiment of the present invention.

FIG. 12 is an equivalent circuit diagram showing details of a memory cell array MA and a reference cell array RA according to a second embodiment of the present invention. Note that in FIG. 12 identical symbols are assigned to identical parts as in FIG. 9 and descriptions thereof are omitted.

The second embodiment differs from the first embodiment in the point that the memory cell array MA and row decoder 3a, and the reference cell array RA and row decoder 3b are positioned so as to be in a precisely line-symmetrical relationship with respect to the direction of extension of bit lines BL. In this case, the selected reference cell RC also is in a line-symmetrical positional relationship with respect to the selected memory cell MC. That is to say, when a memory cell MC which is second from the top where column decoder 2a is disposed and second from the right where row decoder 3a is disposed is selected as the cell to be read on the memory cell array MA side, then the reference cell RC which is second from the top where column decoder 2b is disposed and second from the left where row decoder 3b is disposed is selected on the reference cell array RA side.

In this embodiment also, the resistances of the bit line portion and word line portion of the read current pathway and reference current pathway are configured to be equal, so that the parasitic resistance of the bit line and word line can be made equal for the read current pathway and reference current pathway, and a read of high precision can be realized, regardless of the position (address) of the selected memory cell.

Figure 13:
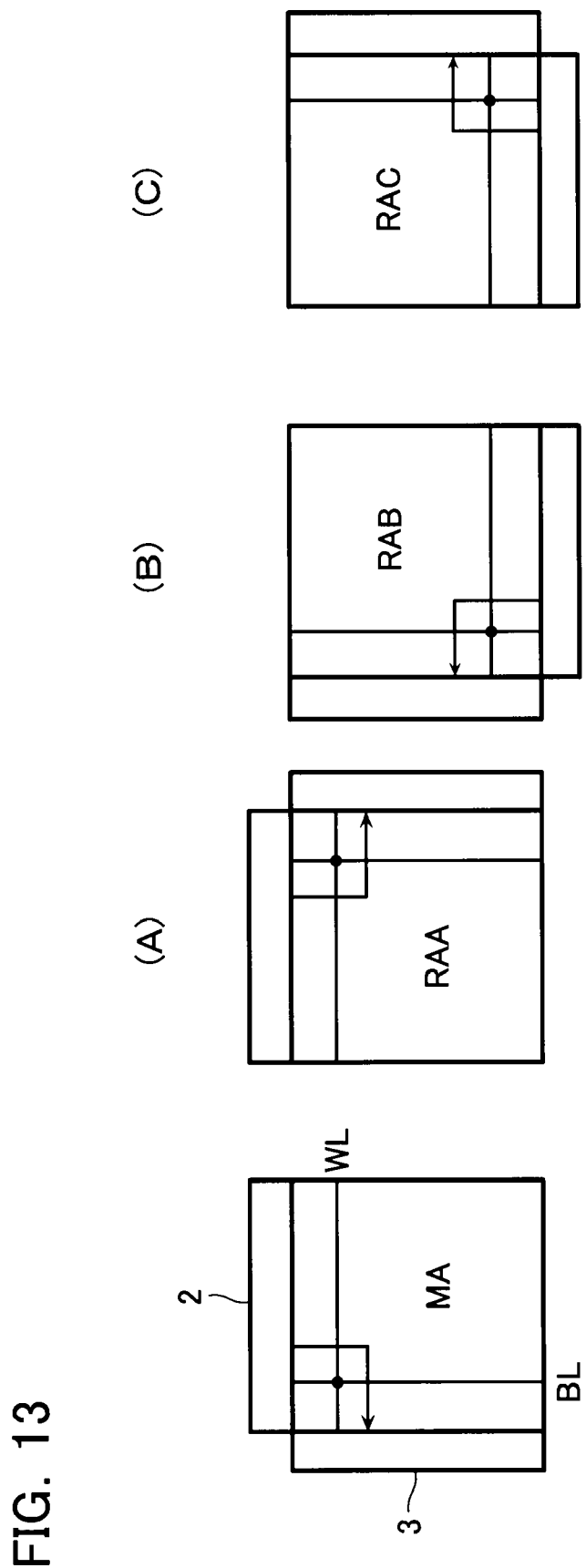
FIG. 13 is a diagram showing a variant example of the same embodiment.

Note that the position of reference cell array RA with respect to memory cell array MA is not limited to the previously described examples. For example, (A) of FIG. 13 shows an example where a reference cell array RAA is disposed line-symmetrically with respect to a regularly-disposed memory cell array MA about a line in the direction of bit lines BL, (B) of the same figure shows an example where a reference cell array RAB is disposed line-symmetrically with respect to a regularly-disposed memory cell array MA about a line in the direction of word lines WL, and (C) of the same figure shows a reference cell array RAC disposed point-symmetrically with respect to a regularly-disposed memory cell array MA. These configurations also offer identical effects as in the previous embodiments.

Third Embodiment

Figure 14:
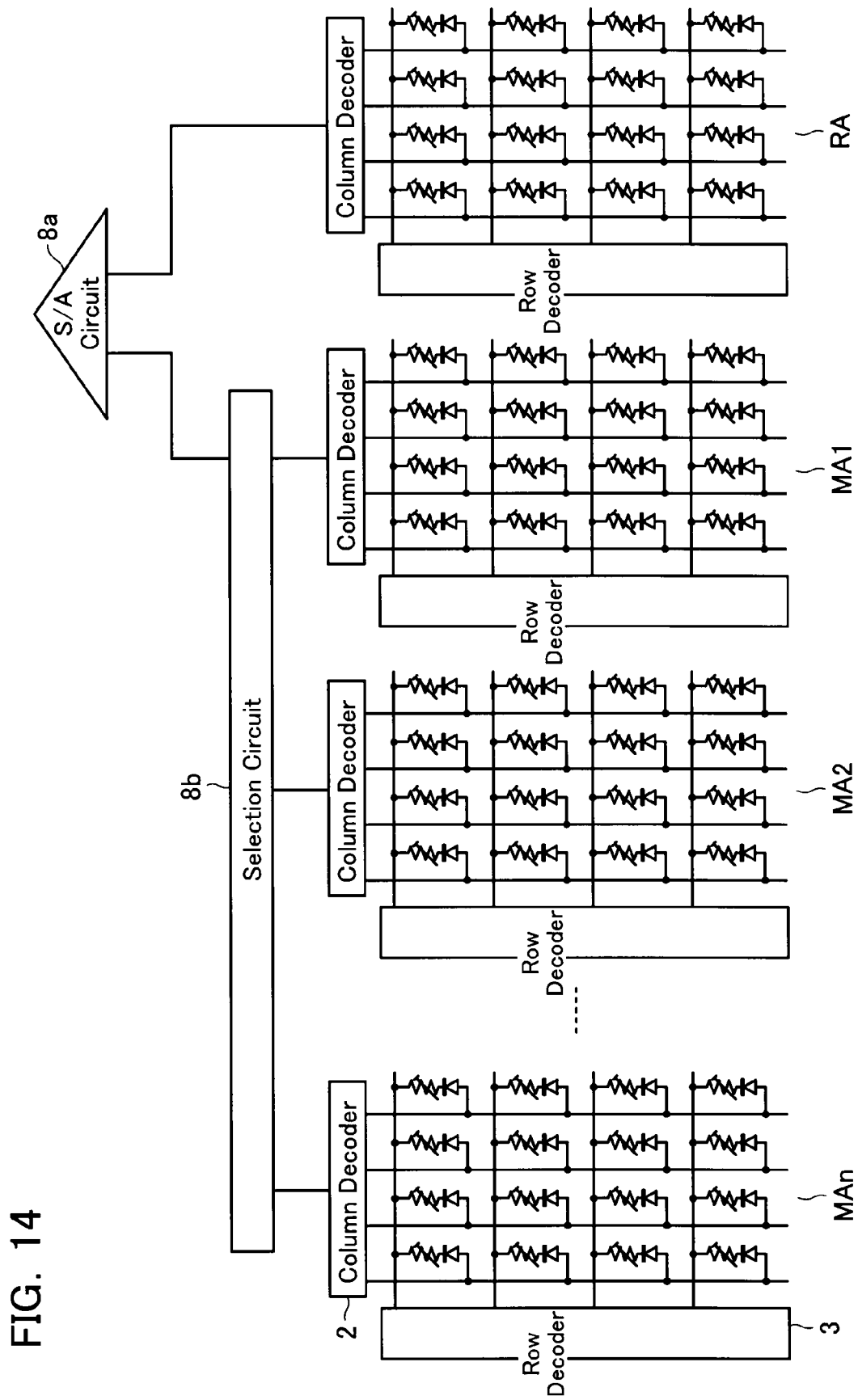
FIG. 14 is a circuit diagram of a memory cell array, a reference cell array, and peripheral circuits thereof in a nonvolatile memory according to a third embodiment of the present invention.

FIG. 14 is an equivalent circuit diagram showing details of a memory cell array MA and a reference cell array RA according to a third embodiment of the present invention.

In the embodiment, one reference cell array RA is shared by a plurality of memory cell arrays MA1, MA2, ..., MAn. Selection circuit 8b selects one memory cell array MA from the plurality of memory cell arrays MA1-MAn and connects it to one of the inputs of S/A circuit 8a.

According to the present embodiment, one reference cell array RA is shared by a plurality of memory cell arrays MA1-MAn, thereby enabling a reduction in space of reference cell arrays RA not used in storing data and an increase in area for disposing memory cells MC.

Fourth Embodiment

Figure 15:
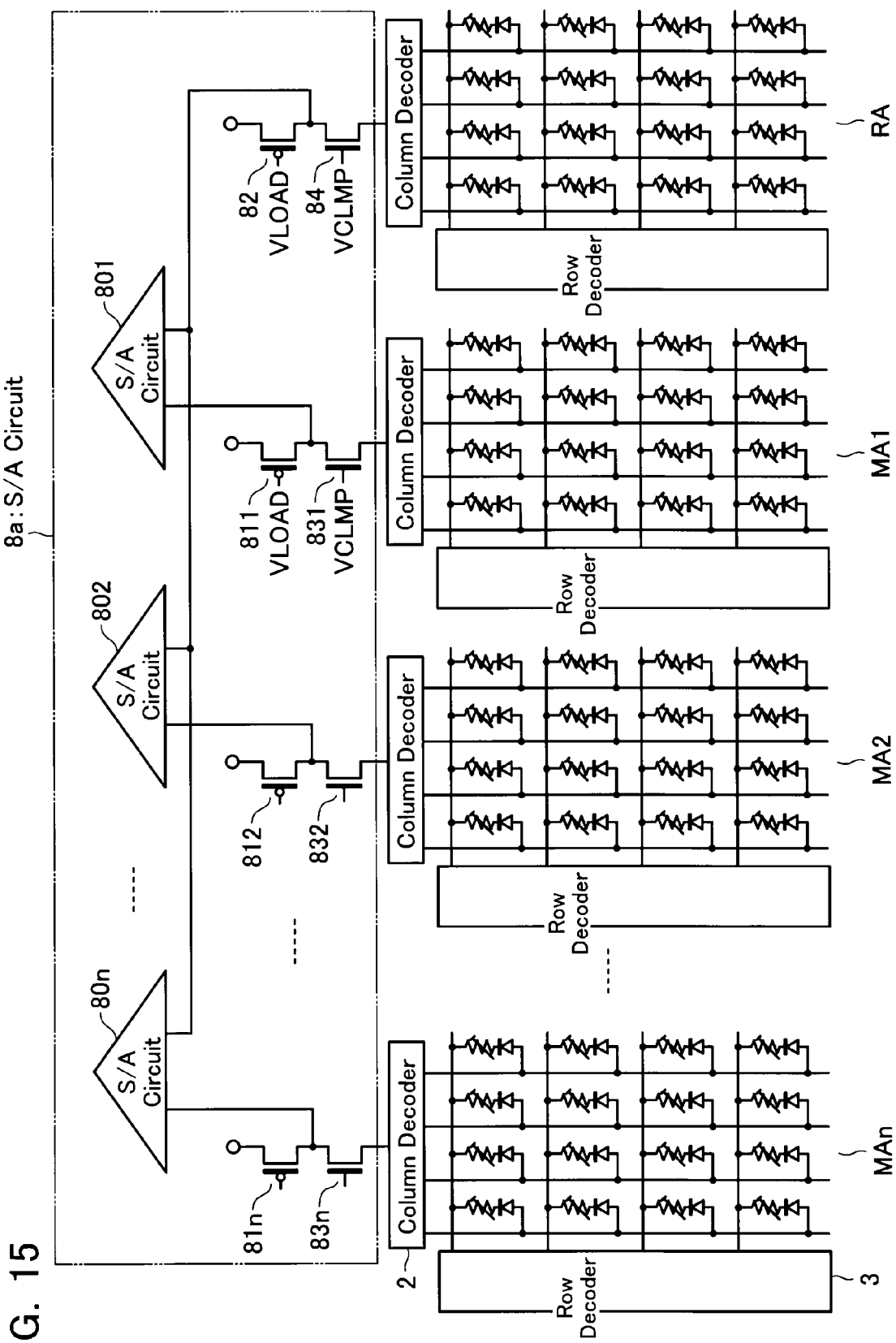
FIG. 15 is a circuit diagram of a memory cell array, a reference cell array, and peripheral circuits thereof in a nonvolatile memory according to a fourth embodiment of the present invention.

FIG. 15 is an equivalent circuit diagram showing details of a memory cell array MA and a reference cell array RA according to a fourth embodiment of the present invention.

This embodiment is identical to the preceding embodiment in the point that one reference cell array RA is shared by a plurality of memory cell arrays MA1, MA2, ..., MAn. However, in this fourth embodiment, differential amplifiers 801, 802, ..., 80n, current source loads 811, 812, ..., 81n, and selection transistors 831, 832, ..., 83n are provided within the S/A circuit 8a corresponding to each memory cell array MA1-MAn, respectively, so that data can be read simultaneously from a plurality of memory cell arrays MA. In this case also, a reference cell is selected whose relative position is identical to the position of the memory cell MC selected in each memory cell array MA.

Fifth Embodiment

Figure 16:
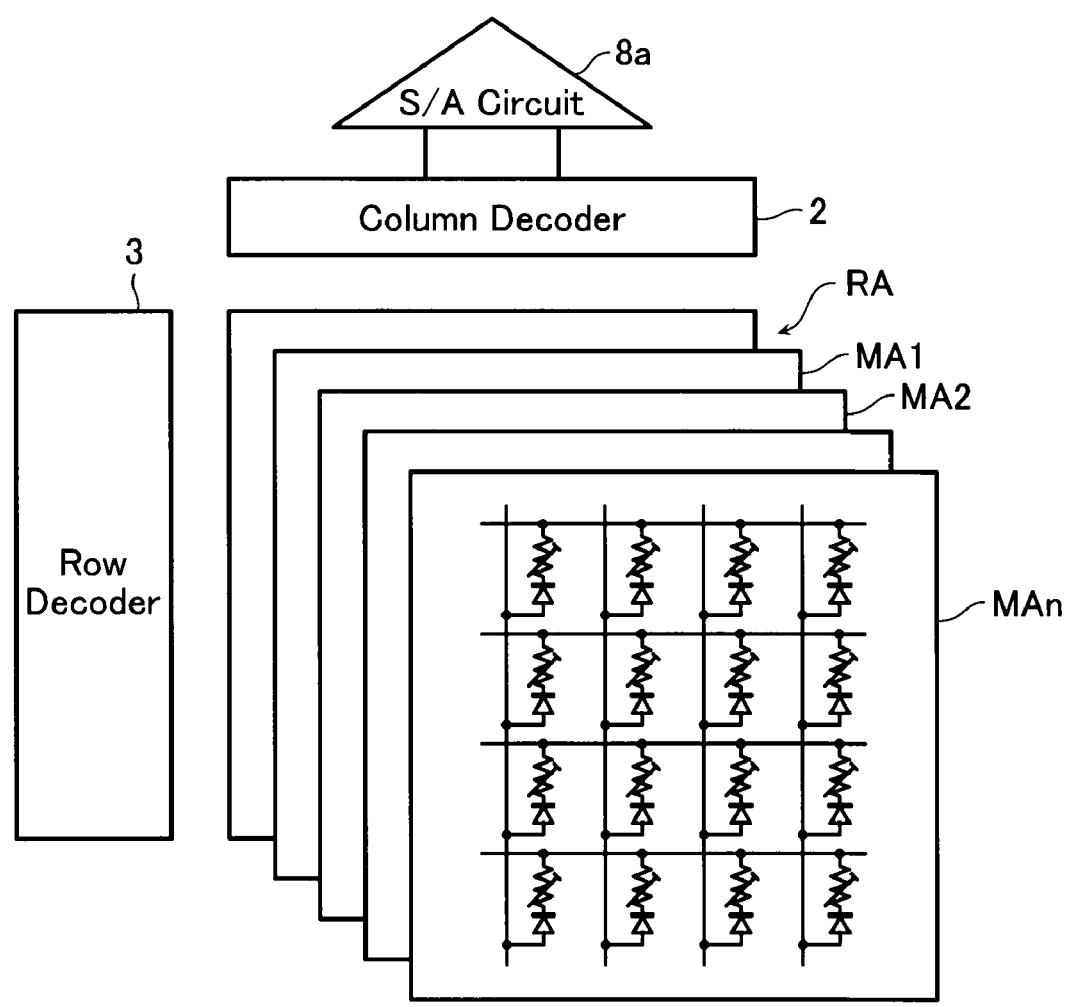
FIG. 16 is a circuit diagram of a memory cell array, a reference cell array, and peripheral circuits thereof in a nonvolatile memory according to a fifth embodiment of the present invention.

FIG. 16 is an equivalent circuit diagram showing details of a memory cell array MA and a reference cell array RA according to a fifth embodiment of the present invention.

In the third and fourth embodiments, a plurality of memory cell arrays MA1-MAn and a reference cell array RA were disposed two-dimensionally within one layer. However, in the present embodiment, a plurality of memory cell arrays MA1-MAn and a single reference cell array RA form a plurality of layers, and differ from the preceding embodiments in the point that they are disposed three-dimensionally in an identical place.

According to the embodiment, there are no variations due to differences in two-dimensional position of disposing. A selected memory cell MC and reference cell RC in identical relative positions are selected, so that the column decoder 2 and row decoder 3 that select these can be shared by the plurality of memory cell arrays MA1-MAn and the reference cell array RA. In addition, with a structure of multilayered cell arrays stacked on a semiconductor substrate, formation of column decoder 2 and row decoder 3 on the semiconductor substrate directly below the cell arrays makes it possible to reduce the space for disposing.

Sixth Embodiment

Figure 17:
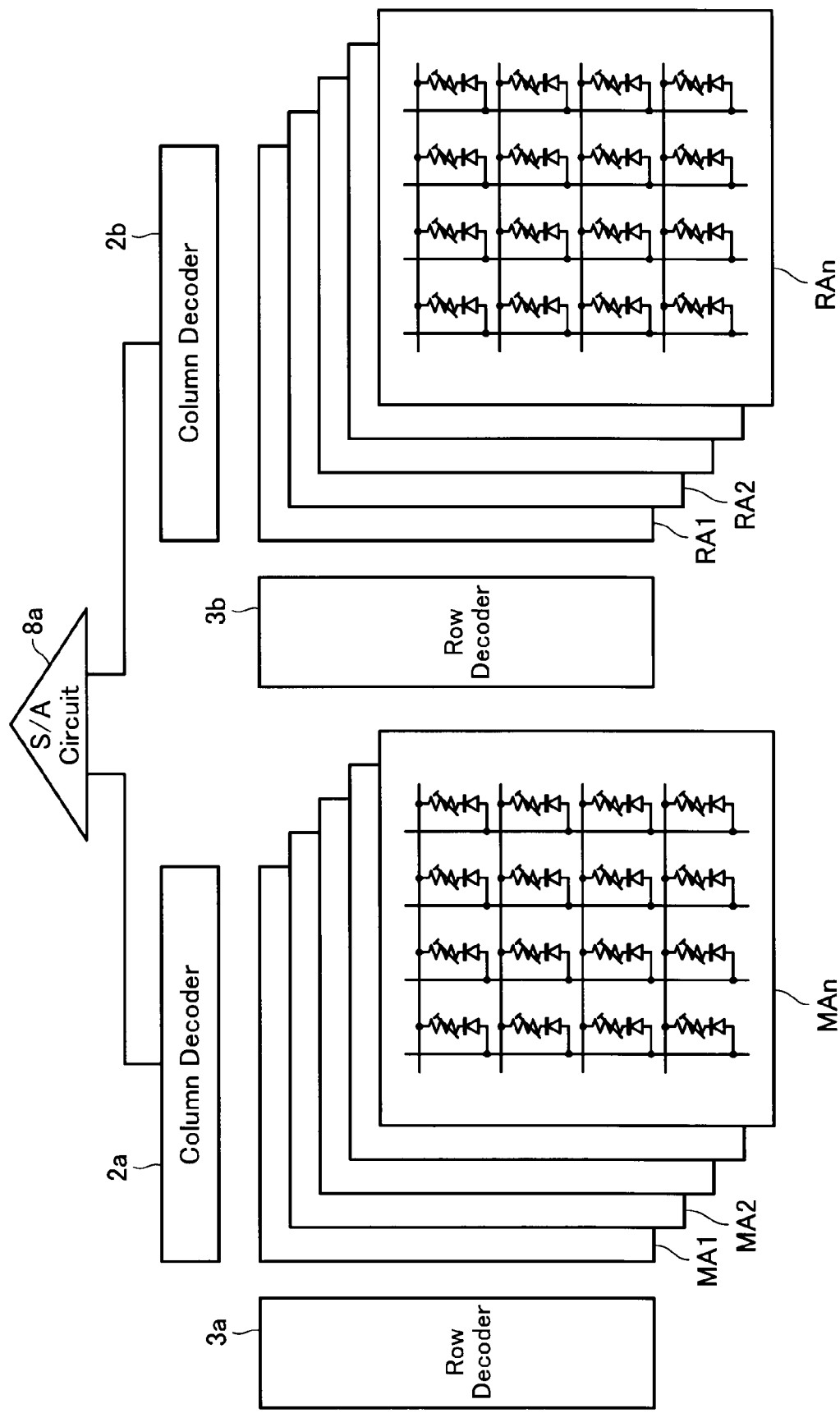
FIG. 17 is a circuit diagram of a memory cell array, a reference cell array, and peripheral circuits thereof in a nonvolatile memory according to a sixth embodiment of the present invention.

FIG. 17 is an equivalent circuit diagram showing details of a memory cell array MA and a reference cell array RA according to a sixth embodiment of the present invention.

In the embodiment, a plurality of memory cell arrays MA1, MA2, ..., MAn are formed in multi-layers and a plurality of reference cell arrays RA1, RA2, ..., RAn are also formed in multi-layers. These memory cell arrays MA1-MAn and reference cell arrays RA1-RAn are disposed in different positions two-dimensionally, but selection is made of a reference cell RC of the same layer and in the same relative position as the selected memory cell MC.

According to the embodiment, a memory cell MC and a reference cell RC of the same layer are selected, thereby the parasitic resistance of the current pathway to both cells can be made identical. In addition, the column decoders 2 and row decoders 3 can be shared by the plurality of memory cell arrays MA1-MAn and the plurality of reference cell arrays RA1-RAn, in an identical manner to the preceding embodiment.

Seventh Embodiment

Figure 18:
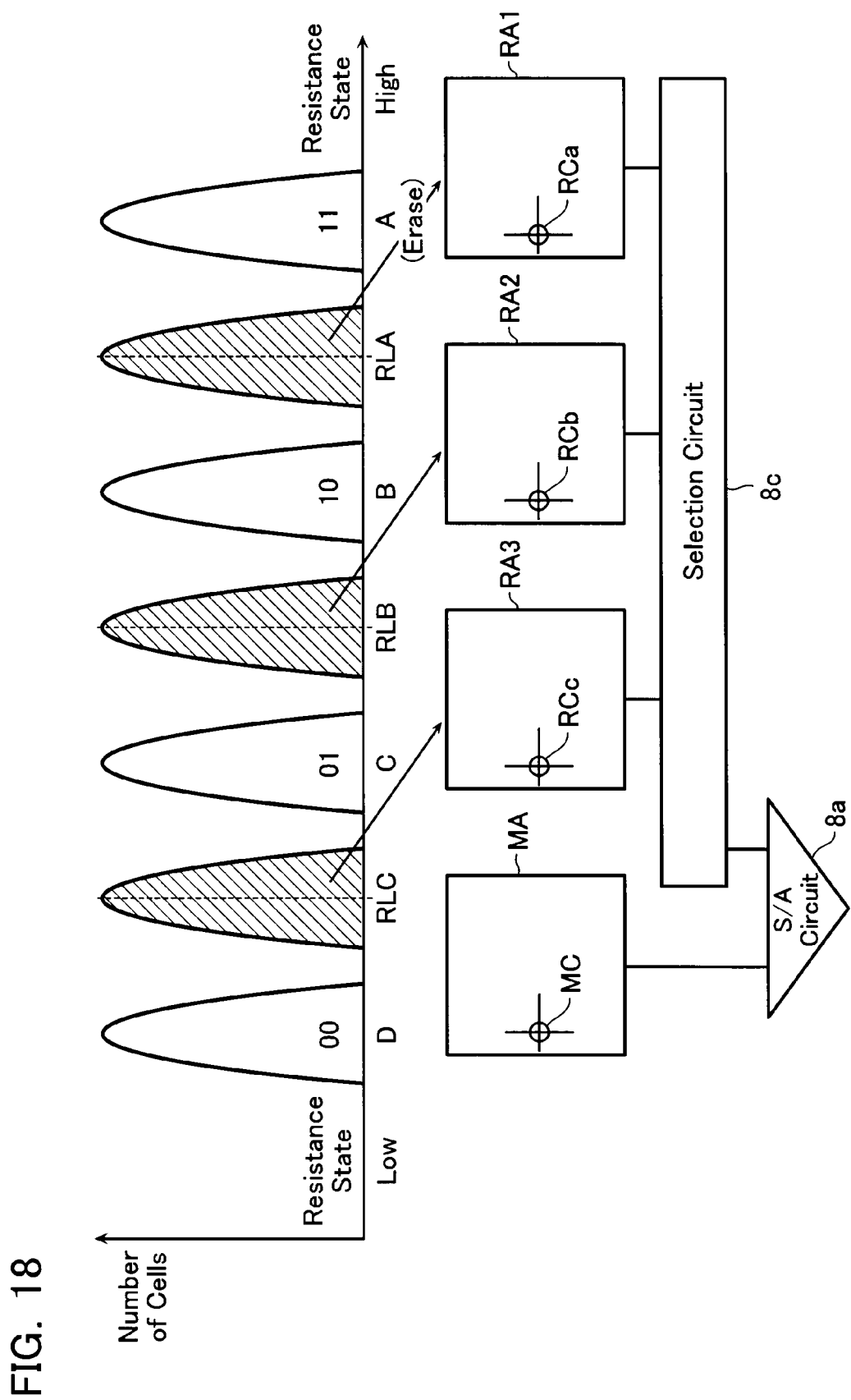
FIG. 18 is a circuit diagram of a memory cell array, a reference cell array, and peripheral circuits thereof in a nonvolatile memory according to a seventh embodiment of the present invention.

FIG. 18 is an equivalent circuit diagram showing details of a memory cell array MA and a reference cell array RA according to a seventh embodiment of the present invention.

The embodiment is an example in which memory cells MC configuring a memory cell array MA store multi-values of ternary or higher data. In the example shown in the figure, a memory cell MC stores quaternary data. The variable resistor VR of the memory cell MC can take the four stages of resistance A, B, C, and D, listed in decreasing order. Two-bit data "11", "10", "01", and "00" is stored corresponding to each resistance. Each of the reference cells RCa, RCb, and RCc that configure the reference cell arrays RA1, RA2, and RA3 are respectively set to the reference resistances RLA, RLB, and RLC between the resistances A, B, C, and D. These reference resistances RLA, RLB, and RLC are set by adjusting the voltage, pulse width, and number of applications of the set pulse applied to the variable resistor VR in reset state.

During data read, reference cell arrays RA1, RA2, and RA3 are sequentially selected by selection circuit 8c and a comparison of the reference currents flowing in the reference cells RCa, RCb, and RCc with the read current flowing in the memory cell MC is effected by S/A circuit 8a, thereby the quaternary data stored in the memory cell MC can be read.

According to the present embodiment, by selecting the reference cells RCa, RCb, and RCc in an identical relative position to the relative position of the selected memory cell MC in memory cell array MA, the resistance can be made equal for the read current pathway and reference current pathway, achieving the effect of enabling a high precision read.

Eighth Embodiment

Figure 19:
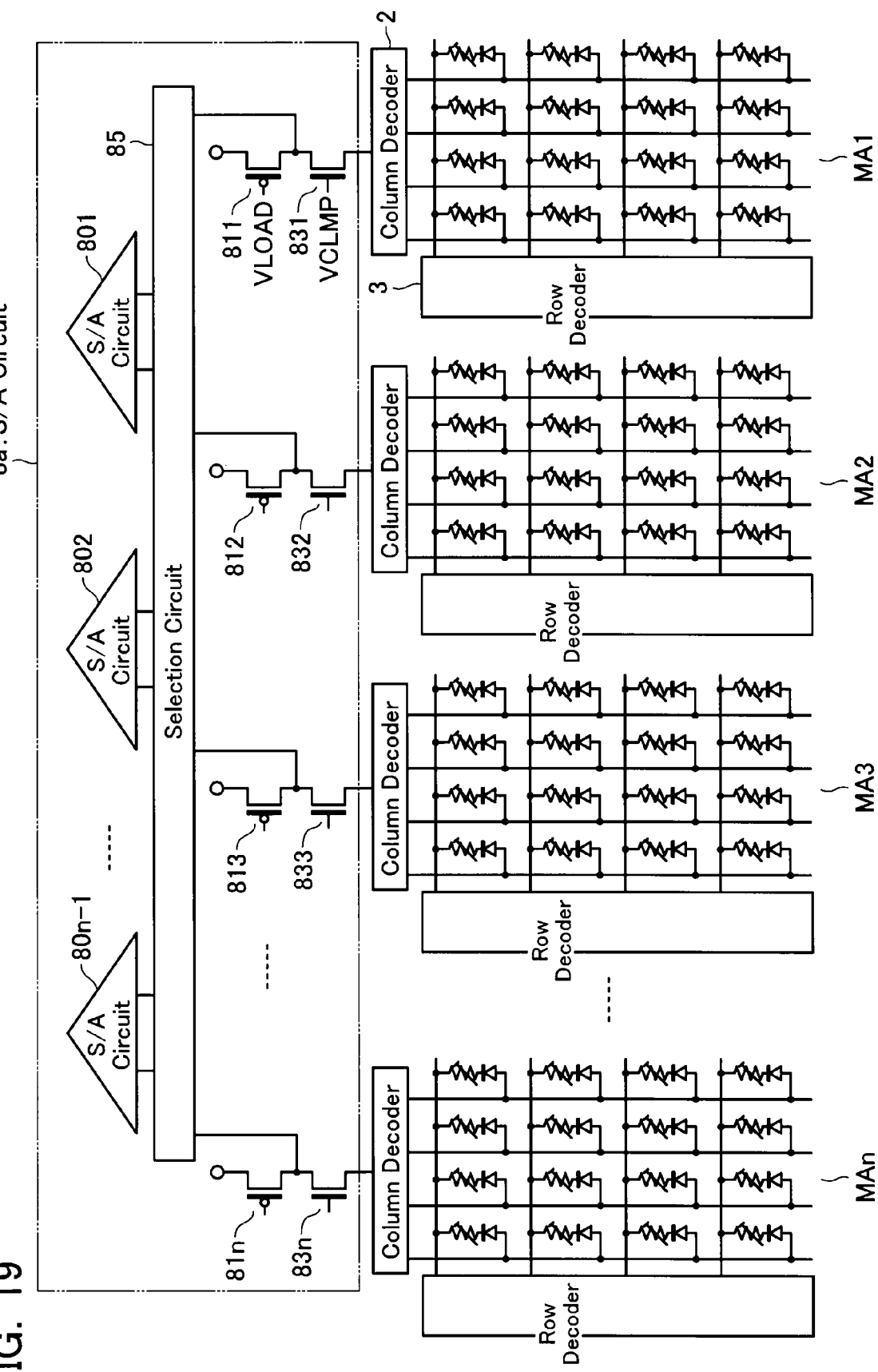
FIG. 19 is a circuit diagram of a memory cell array, a reference cell array, and peripheral circuits thereof in a nonvolatile memory according to an eighth embodiment of the present invention.

FIG. 19 is an equivalent circuit diagram showing details of a memory cell array MA and a reference cell array RA according to an eighth embodiment of the present invention.

In the embodiment, one of a plurality of memory cell arrays MA1-MAn is selected as a reference cell array RA. n−1 differential amplifiers 801-80n−1 are provided with respect to the n memory cell arrays MA1-MAn.

According to the embodiment, after chip manufacture, one memory cell array MA is selected from n memory cell arrays MA1-MAn in accordance with data programmed in a fuse, an intermediate resistance is written to the selected memory cell array MA, and the selected memory cell array MA thereby functions as a reference cell array RA.

If dynamic determination of the reference cell array RA is made possible in this way, selecting a cell array that includes as few faulty bits as possible can bring about improvement in yield ratio of chips. Note that faulty bits in memory cell arrays MA can be dealt with using redundant cell replacement.

What is claimed is:
1. A semiconductor memory device, comprising:
   a plurality of cell arrays, each cell array including a plurality of word lines, a plurality of bit lines disposed to overlap the word lines, and a plurality of cells electri- cally connected between the word lines and bit lines, respectively, one portion of the cell arrays forming a memory cell array that has said cells as memory cells, and another portion of the cell arrays forming a reference cell array that has said cells as reference cells;

a cell selection circuit operative to select from said memory cell array a memory cell whose data is to be read, and to select from said reference cell array a reference cell at a position corresponding to a position of the memory cell selected in said memory cell array; and a sense amplifier circuit operative to detect and compare a current or a voltage of said selected memory cell with a current or a voltage of said selected reference cell, and thereby read data of said memory cell, wherein said memory cell array and reference cell array have an identical structure.

2. The semiconductor memory device according to claim 1, wherein a resistance of said reference cells stores a first value, and said sense amplifier circuit reads data of said memory cells by detecting whether a current or a voltage of said selected memory cell is higher than a current or a voltage generated by said first value or said current or said voltage of said selected memory cell is lower than said current or said voltage generated by said first value.

3. The semiconductor memory device according to claim 2, wherein said first value is an intermediate value of two physical amounts stored as data by said memory cells.

4. The semiconductor memory device according to claim 3, wherein said intermediate value is a value between a physical amount stored as a setting level and a physical amount stored as a resetting level.

5. The semiconductor memory device according to claim 3, wherein said reference cell array is arranged point-symmetrically or line-symmetrically with respect to said memory cell array.

6. The semiconductor memory device according to claim 3, wherein said cell selection circuit selects said reference cell so that a relative position of a selected memory cell in said memory cell array is identical to a relative position of a selected reference cell in said reference cell array.

7. The semiconductor memory device according to claim 3, wherein one reference cell array is provided with respect to a plurality of memory cell arrays, said reference cell array serving as common reference for these memory cell arrays.

8. The semiconductor memory device according to claim 7, wherein said sense amplifier circuit is shared by a plurality of said memory cell arrays.

9. The semiconductor memory device according to claim 3, wherein said cell selection circuit dynamically selects a reference cell array from said plurality of cell arrays.

10. The semiconductor memory device according to claim 3, wherein said memory cell arrays and reference cell arrays are stacked in a vertical direction with respect to the planar surface formed by said word lines and bit lines.

11. The semiconductor memory device according to claim 3, wherein said memory cells are multi-value memory cells that store ternary or higher write data and are provided with said reference cell array comprising said reference cells holding a threshold value of each value, the reference cell array being provided for each threshold value.

12. The semiconductor memory device according to claim 3, wherein said cells comprise variable resistors.

13. A semiconductor memory device, comprising:

a plurality of cell arrays, each cell array including a plurality of word lines, a plurality of bit lines disposed to overlap the word lines, and a plurality of cells electrically connected between the word lines and bit lines, respectively, one portion of the cell arrays forming a memory cell array that has said cells as memory cells, and another portion of the cell arrays forming a reference cell array that has said cells as reference cells;

a decoder provided to each said cell array and operative to select a said cell; and a sense amplifier circuit operative to detect and compare a current or a voltage of said memory cell and reference cell selected by said decoder, and thereby read data of said memory cell, wherein, during data read, said decoder provided to said reference cell array selects a predetermined reference cell so that a relative position of the selected reference cell with respect to the decoder for said reference cell array is the same as the relative position of the selected memory cell with respect to the decoder for said memory cell array, and wherein said memory cell array and reference cell array have an identical structure.

14. The semiconductor memory device according to claim 13, wherein a resistance of said reference cells stores a first value, and said sense amplifier circuit reads data of said memory cells by detecting whether a current or a voltage of said selected memory cell is higher than a current or a voltage generated by said first value or said current or said voltage of said selected memory cell is lower than said current or said voltage generated by said first value.

15. The semiconductor memory device according to claim 14, wherein said first value is an intermediate value of two physical amounts stored as data by said memory cells.

16. The semiconductor memory device according to claim 15, wherein said intermediate value is a value between a physical amount stored as a setting level and a physical amount stored as a resetting level.

17. The semiconductor memory device according to claim 15, wherein said decoder comprises a row decoder operative to select said word lines and a column decoder operative to select said bit lines, and wherein a spacing between the selected memory cell and the row decoder and column decoder in said memory cell array is the same as a spacing between the selected reference cell and the row decoder and column decoder in said reference cell array.

18. The semiconductor memory device according to claim 15, wherein one reference cell array is provided with respect to a plurality of memory cell arrays, said reference cell array serving as common reference for these memory cell arrays.

19. The semiconductor memory device according to claim 15, wherein said cell selection circuit dynamically selects a reference cell array from said plurality of cell arrays.

20. A semiconductor memory device, comprising:

a plurality of cell arrays including a plurality of word lines, a plurality of bit lines disposed to overlap the word lines, and a plurality of cells connected between the word lines and bit lines;

a cell selection circuit operative to select as a memory cell a said cell whose data is to be read, and to select as a reference cell another said cell such that a reference current pathway of selected said reference cell has an equivalent resistance to a read current pathway of selected said memory cell; and a sense amplifier circuit operative to detect and compare a current or a voltage of said selected memory cell with a current and a voltage of said selected reference cell, and thereby read data of said memory cell, wherein said memory cell belongs to a predetermined said cell array that is a memory cell array, wherein said reference cell belongs to a predetermined said cell array that is a reference cell array and which is different to said memory cell array, wherein said memory cell array and reference cell array have an identical structure, wherein a relative position of a reference cell selected in said reference cell array is equal to a relative position of a memory cell selected in said memory cell array, and wherein said reference cell stores an intermediate value of two physical amounts stored as data by said memory cell.

* * * * *